(12) United States Patent
Gonzalez Martin

(10) Patent No.: US 11,308,820 B2
(45) Date of Patent: Apr. 19, 2022

(54) COMPACT MOVEMENT SIMULATOR

(71) Applicant: Francisco Jose Gonzalez Martin, Malaga (ES)

(72) Inventor: Francisco Jose Gonzalez Martin, Malaga (ES)

( * ) Notice: Subject to any disclaimer, the term of this patent is extended or adjusted under 35 U.S.C. 154(b) by 109 days.

(21) Appl. No.: 16/753,616

(22) PCT Filed: Sep. 25, 2018

(86) PCT No.: PCT/ES2018/070615
§ 371 (c)(1),
(2) Date: Apr. 3, 2020

(87) PCT Pub. No.: WO2019/068944
PCT Pub. Date: Apr. 11, 2019

(65) Prior Publication Data
US 2020/0242959 A1    Jul. 30, 2020

(30) Foreign Application Priority Data
Oct. 5, 2017  (ES) .............................. ES201731174U

(51) Int. Cl.
*G09B 9/02* (2006.01)
*G09B 9/12* (2006.01)

(52) U.S. Cl.
CPC . *G09B 9/02* (2013.01); *G09B 9/12* (2013.01)

(58) Field of Classification Search
CPC ... G09B 9/02; G09B 9/04; G09B 9/05; G09B 9/12; G10L 21/0232; G10L 21/0264; H03G 5/16
See application file for complete search history.

(56) References Cited

U.S. PATENT DOCUMENTS

| | | | |
|---|---|---|---|
| 5,509,631 A | 4/1996 | De Salvo | |
| 9,353,903 B2* | 5/2016 | Kang | G09B 9/00 |
| 9,782,683 B2* | 10/2017 | Lee | G09B 9/02 |
| 2005/0277092 A1* | 12/2005 | Hwang | G09B 9/12 |
| | | | 434/55 |
| 2010/0028837 A1* | 2/2010 | Holloway | G09B 9/12 |
| | | | 434/30 |
| 2015/0030999 A1* | 1/2015 | Lee | G09B 9/02 |
| | | | 434/62 |

* cited by examiner

*Primary Examiner* — Eddy Saint-Vil
(74) *Attorney, Agent, or Firm* — Hayes Soloway P.C.

(57) ABSTRACT

The present invention pertains to the technical field of teaching or training simulators, more specifically the field of those especially designed for providing instruction on driving vehicles or other means of transport, and it particularly refers to a compact motion simulator for creating motion in three directions.

5 Claims, 4 Drawing Sheets

COMPACT MOVEMENT SIMULATOR

CROSS-REFERENCE TO RELATED APPLICATIONS AND PRIORITY

This patent application claims priority from PCT Patent Application No. PCT/ES2018/070615 filed Sep. 25, 2018, which claims priority from Spanish Patent Application No. ESU201731174 filed Oct. 5, 2017. Each of these patent applications are herein incorporated by reference in its/their entirety.

OBJECT OF THE INVENTION

The present invention pertains to the technical field of teaching or training simulators, more specifically the field of those especially designed for providing instruction on driving vehicles or other means of transport, and it particularly refers to a compact motion simulator for creating motion in three directions.

BACKGROUND OF THE INVENTION

Motion simulators are commonly used either as training devices for pilot training or as gaming devices in the entertainment industry. The common basic operating principle of these motion simulators is that a cabin or seat in which a user is located is made to tilt around a longitudinal axis and/or a transverse axis in order to simulate, by using the force of gravity, the forces of inertia that arise from accelerating, braking or driving through a curve. To do so, the cabin must be suspended such that it can move in at least two, and preferably three or more degrees of freedom, in a specific area.

Suspensions with elements known as hexapods, which allow motion in all six degrees of freedom despite having a very complex design and also requiring complex control, are common. Furthermore, these suspensions have the drawback that the hexapods must be securely fastened to the floor and are relatively bulky, such that a sufficiently large support surface is needed and the cabin must have a relatively large entrance height.

On the other hand, the motion simulators known in the current state of the art that are simpler comprise a series of pneumatic hydraulic cylinders connected by different areas to generate motion and different inclinations of the user's seat, causing the seat to move by varying the length of said cylinders. Due to the means used for the actuation thereof, these simulators have limitations on generating motion, which are generally only lateral tilting or tilting in a forward/backward direction.

DESCRIPTION OF THE INVENTION

The object of the invention consists of a small, geometrically compact motion simulator device, designed for domestic use in gaming devices and for professional use in education and training.

To do so, said device mainly comprises a chair intended to accommodate a user in a seated position, the chair being attached to a lower platform from which at least three tilting feet extend, each of which is in turn attached to a respective rolling linear guide. In the resting position of the device, each of said feet is inclined between 30 and 60 degrees with respect to a horizontal plane defined by the linear guide.

Likewise, each foot has an upper end through which it is attached to the lower platform of the seat by means of a first joint, preferably a bolt or a pin. A lower end of the foot has a second joint, preferably a ball joint, which is attached by means of securing to the rolling linear guide thereof.

In turn, each of said guides comprises an actuator element, preferably a ball screw, and an actuated element, preferably a rolling linear guide. An external controller, governed by a specific computer program, governs the movement of the linear guides, and therefore of the feet and of the seat attached to them.

In a preferred embodiment, the computer program extracts data from the telemetry of the game or training program and transforms it into movement parameters for each of the linear guides, thus obtaining three-dimensional movement of the seat due to the combined and synchronised motion of the rolling linear guides attached to the feet.

The compact motion simulator thus described entails a simple, cheap and versatile solution for providing all types of small spaces with a device capable of realistically simulating all types of movement to which the driver of an actual vehicle may be subjected.

DESCRIPTION OF THE DRAWINGS

In order to complement the description being made and with the object of helping to better understand the characteristics of the invention, in accordance with a preferred practical exemplary embodiment thereof, said description is accompanied, as an integral part thereof, by a set of drawings where, in an illustrative and non-limiting manner, the following has been represented.

PREFERRED EMBODIMENT OF THE INVENTION

With the aid of the previously mentioned figures, a detailed explanation of a preferred exemplary embodiment of the object of the present invention is provided below.

The compact motion simulator that is described is made up of a seat (1) intended to accommodate a user, controls for simulating the own controls of a vehicle, and supports that extend from the bottom of the seat (1) to link it to a lower platform (2).

Figure 1:
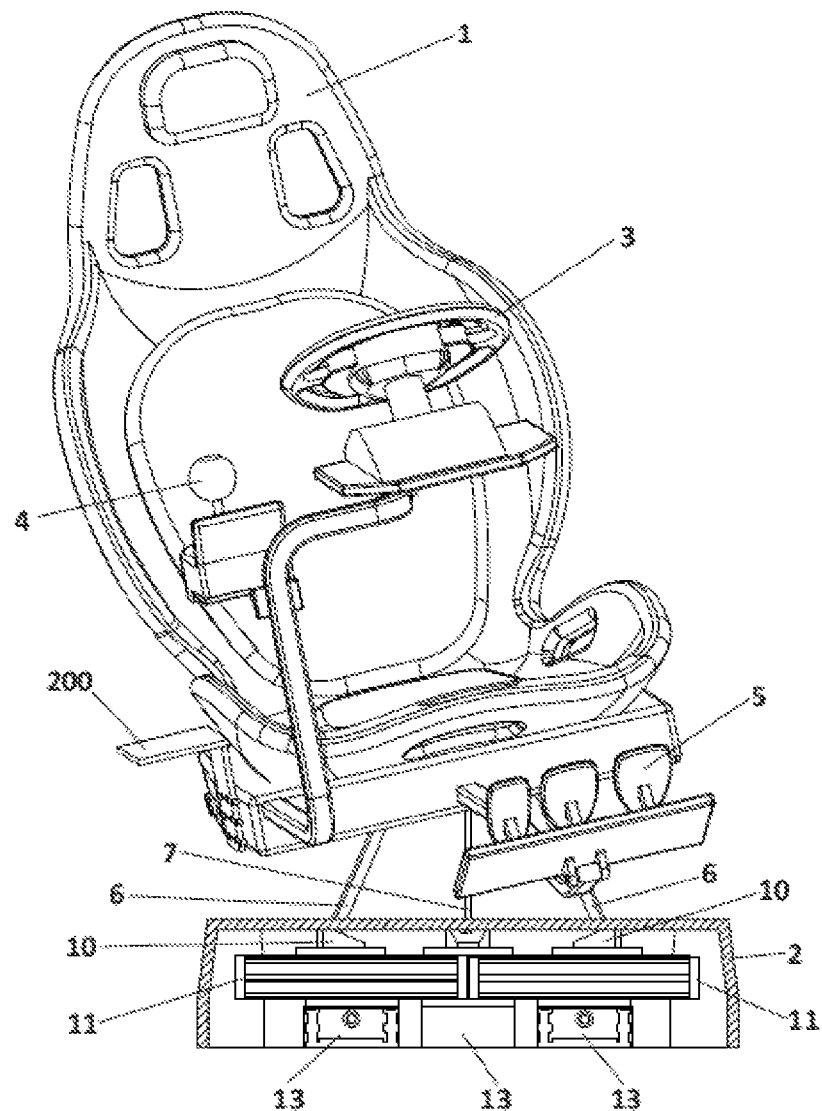
FIG. 1.—Shows a front view of the compact motion simulator in a working position, in which the main constituting elements thereof can be seen.

In a preferred embodiment herein described, as shown in FIG. 1, the adjustable position and height controls comprise a steering wheel (3), a gear lever (4) and pedals (5), and the simulator comprises three supports for attaching the seat (1) to the lower platform (2), two front supports (6) and one rear support (7). As shown in the attached figures, said supports (6,7) have an essentially elongated geometry, similar to that of the feet of a chair.

With the aim of increasing the versatility of the simulator, the incorporation of a platform (200) for coupling additional controls is envisaged to thus extend the range of vehicles whose motion can be reproduced by the simulator. In the attached figures it can be seen that in this embodiment said platform (200), of adjustable position and height, is located preferably lateral to the seat (1), in order to, for example, temporarily couple the steering control of an aircraft.

Figure 2:
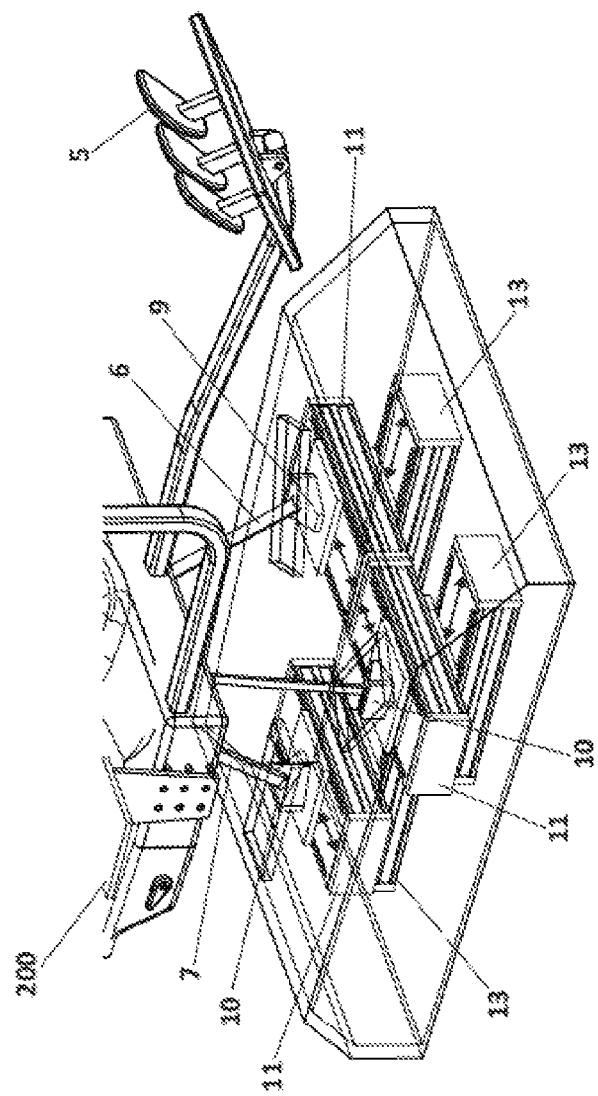
FIG. 2.—Shows a perspective view of a section made in the platform of the simulator in a resting position, in which the elements of the movement mechanism can be seen.
Figure 3:
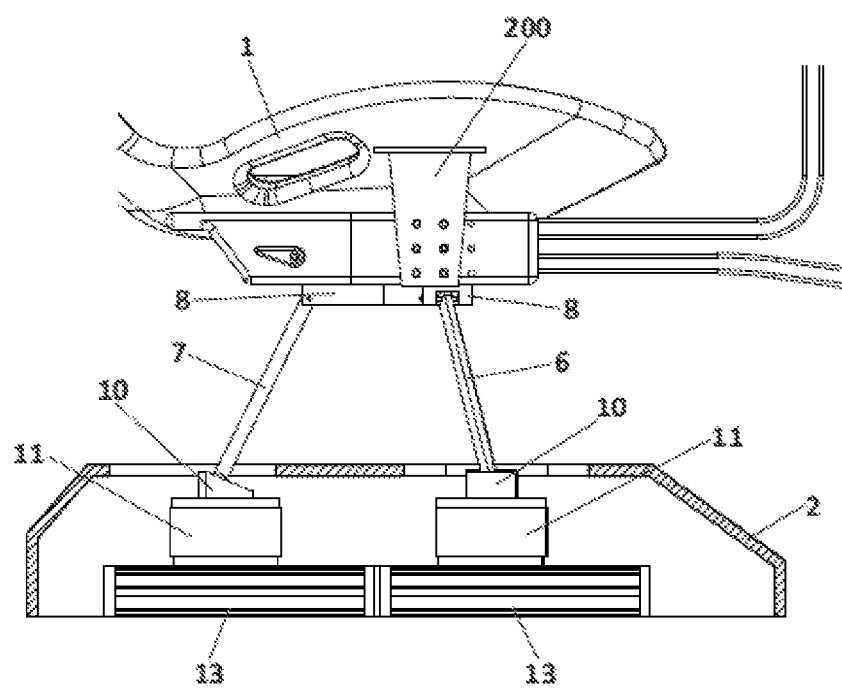
FIG. 3.—Shows a left side view of a section made in the platform of the simulator in the resting position of FIG. 2, in which the position of the supports can be seen.

In the resting position of the device, shown in FIGS. 2 and 3, the supports (6,7) extend obliquely to and from the bottom of the seat (1). Each of said supports (6,7) likewise has an upper end through which it is attached to the seat (1) through a first joint (8), and a lower end with a second joint (9) through which it is attached and rests on a runner (10). In this preferred embodiment, the first joint (8) is a bolt or pin, while the second joint (9) is ball joint.

Likewise, it is envisaged that said second joint (9) is covered by a flexible rubber material or similar, not shown in the attached figures, to protect said second joint (9) as well as to prevent possible accidents.

In turn, each runner (10) moves longitudinally through a movable guide (11), actuated by a corresponding first electric motor (12), which in this preferred embodiment is a servomotor due to the optimum accuracy of positioning, dynamics and speed thereof. Each movable guide (11) moves, in turn, through a fixed guide (13), below and transverse to said movable guide (11), by the actuation of a corresponding second electric motor (14), which in this preferred embodiment is also a servomotor.

Figure 4:
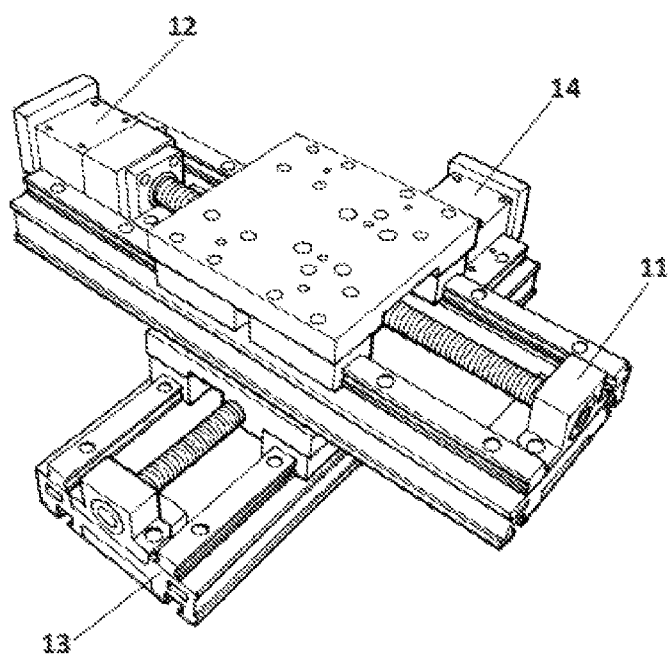
FIG. 4.—Shows a perspective view of the arrangement of the actuation guides of the simulator.

FIG. 4 shows the arrangement of a movable guide (11) with respect to the corresponding fixed guide thereof (13), as well as the location of the electric motors (12,14), housed in an inner compartment of said guides (11,13).

An external controller, not shown in the attached figures, governs and synchronises the set of first (12) and second electric motors (14). Said external controller, based on a specific software, extracts telemetry data of a videogame and transforms it into linear movement parameters, which are sent to said first (12) and second electric motors (14) so that they actuate the respective runners (10) and movable guides (11).

Thus, the combined and synchronised action of the sliding of the three runners (10) and the three movable guides (10) enables the movement of the seat (1) in the three spatial axes by means of the movement of the supports (6,7) thereof caused by said sliding, leading to vertical, longitudinal and transverse motion of the seat (1) in order to realistically simulate the movements to which a driver in an actual vehicle would be subjected.

The invention claimed is:

1. A compact motion simulator made up of:
   a seat,
   controls for simulating controlling a vehicle, and
   three supports, distributed as two front supports and one rear support, that extend from the bottom of the seat, wherein each one of the three supports has:
      an upper end with a first joint, and
      a lower end with a second joint,
   wherein the compact motion simulator comprises:
      runners, wherein each one of the runners is linked to each one of the three supports by means of each respective one of the second joints, thus, resting each of the three supports on each corresponding one of the runners,
      movable guides, wherein each one the movable guides is placed below each respective one of the runners, moving each one of the runners longitudinally through each respective one of the movable guides,
      fixed guides, wherein each one of the fixed guides is placed below and transverse to each respective one of the movable guides wherein each one of the movable guides moves longitudinally through each respective one of the fixed guides,
      first electric motors, connected to and for actuating the runners second electric motors, connected to and for actuating the movable guides, and
      an external controller connected to and for controlling the first and second electric motors based on linear movement parameters.

2. The compact motion simulator according to claim 1, wherein the three supports extend obliquely to the seat.

3. The compact motion simulator according to claim 1, wherein the second joints are ball joints.

4. The compact motion simulator according to claim 1, wherein the first joints are pins.

5. The compact motion simulator according to claim 1, wherein the first and second electric motors are servomotors.

* * * * *